United States Patent
Miles

(10) Patent No.: US 6,235,597 B1
(45) Date of Patent: May 22, 2001

(54) SEMICONDUCTOR STRUCTURE HAVING REDUCED SILICIDE RESISTANCE BETWEEN CLOSELY SPACED GATES AND METHOD OF FABRICATION

(75) Inventor: Glen L. Miles, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/369,532

(22) Filed: Aug. 6, 1999

(51) Int. Cl.[7] .................................................. H01L 21/336
(52) U.S. Cl. ........................ 438/301; 438/303; 438/305
(58) Field of Search ................................. 438/305, 307, 438/301, 303, 564

(56) References Cited

U.S. PATENT DOCUMENTS

| | | | |
|---|---|---|---|
| 4,818,714 | 4/1989 | Haskell | 437/44 |
| 5,290,720 * | 3/1994 | Chen | 437/41 |
| 5,550,084 | 8/1996 | Anjum et al. | 437/200 |
| 5,686,331 | 11/1997 | Song | 437/41 |
| 5,702,972 | 12/1997 | Tsai et al. | 437/56 |
| 5,723,893 | 3/1998 | Yu et al. | 257/413 |
| 5,770,508 * | 6/1998 | Yeh et al. | 438/305 |
| 5,814,553 | 9/1998 | Chuang et al. | 438/595 |
| 5,817,562 * | 10/1998 | Chang et al. | 438/305 |
| 5,817,563 * | 10/1998 | Lim | 438/307 |
| 6,090,691 * | 7/2000 | Ang et al. | 438/564 |

* cited by examiner

*Primary Examiner*—John F. Niebling
*Assistant Examiner*—Walter L. Lindsay, Jr.
(74) *Attorney, Agent, or Firm*—Connolly Bove Lodge & Hutz; William D. Sabo

(57) ABSTRACT

A semiconductor structure comprising a plurality of gates located on a semiconductor substrate; wherein insulating spacer is provided on sidewalls of the gates; and metallic silicide located between the gates is provided along with a method for its fabrication. A partially disposable spacer permits increased area for silicide formation without degrading the device short channel behavior.

19 Claims, 2 Drawing Sheets

SEMICONDUCTOR STRUCTURE HAVING REDUCED SILICIDE RESISTANCE BETWEEN CLOSELY SPACED GATES AND METHOD OF FABRICATION

TECHNICAL FIELD

The present invention relates to a semiconductor structure having metallic silicide in source/drain regions and especially source/drain regions between closely spaced gate structures. In particular, the present invention includes forming an L-shaped spacer between adjacent gate structures. The L-shaped spacer is used to form shallow source/drain regions adjacent to the gates, independent of the lightly doped drain regions (LDDs). The L-shaped spacer is subsequently modified to increase the available area for silicide formation without the silicide directly contacting the lightly doped drain regions.

BACKGROUND OF INVENTION

In fabricating semiconductor structures, the source/drain resistance is reduced by forming a layer of a refractory metal silicide. In particular, a refractory metal is deposited and then subjected to elevated temperatures, thereby reacting with underlying silicon to form what is commonly referred to as a "silicide". Silicides are well known in the art and provide dependable silicon contacts as well as low ohmic resistance.

Silicides are commonly used to reduce the source/drain resistance between adjacent gate structures. However, as device dimensions shrink, so does the spacing between adjacent gate structures. The available space for silicide formation shrinks faster than the ground rules for gate-to-gate spacing due to the finite width of the gate spacers. The shrinking lateral dimensions increase the resistance of any device that uses the source/drain as a conduction path. The formation of silicide in narrow spaces between gates may also be more difficult, leading to an elevated and variable resistance in these regions.

SUMMARY OF INVENTION

The present invention provides for increasing the space available for silicide formation between closely spaced gate structures thereby lowering the diffusion resistance. In particular, the present invention provides for an effectively narrower spacer between gate structures during silicide formation without degrading the device short channel behavior. More particularly, the present invention provides for a partially disposable spacer process for improving silicide formation between gate structures. According to the present invention, an L-shaped spacer is formed which is used to form shallow source/drain regions, independent of the lightly doped drain regions and the deep source/drain regions where the device contacts are placed, and to form the silicide without direct contact to the lightly doped drain regions.

More particularly, the present invention relates to a semiconductor structure comprising a semiconductor substrate having a plurality of gates located thereon and being separated from the semiconductor substrate by a first insulating layer. A sidewall of at least one gate of a plurality of gates is separated from an adjacent sidewall of an adjacent gate by a distance of about 0.5 $\mu$m or less; and the sidewalls of the gates include an insulating spacer containing one or more dielectric layers. Metallic silicide is located between adjacent gates on the semiconductor substrate. Source/drain doping is located beneath the metallic silicide. A doped junction is present between the source/drain doping and the gate channel region and extends beneath the insulating spacer.

Another aspect of the present invention relates to a method for fabricating a semiconductor structure. The method comprises providing a semiconductor substrate and providing a plurality of gates located on the semiconductor substrate and being separated from the semiconductor substrate by a first insulating layer. Optionally, first dopants (LDDS) are implanted into the substrate in the spacing between adjacent gates. Insulating spacers are provided on sidewalls of the gates. The insulating spacers are L-shaped having a vertical portion and a horizontal portion. Spacing exists between adjacent L-shaped insulating spacers. Source/drain dopants are implanted between adjacent L-shaped insulating spacers and beneath the horizontal portion of the L-shaped insulating spacer. The horizontal portion of the L-shaped spacer partially blocks the source/drain dopants, thereby reducing their depth. The horizontal portion of the L-shaped insulating spacers is subsequently removed by etching, followed by forming a metallic silicide in the spacing between adjacent gates. The removal of horizontal portions of the L-spacers increases the area of silicide formation thereby lowering the diffusion resistance.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

Figure 1:
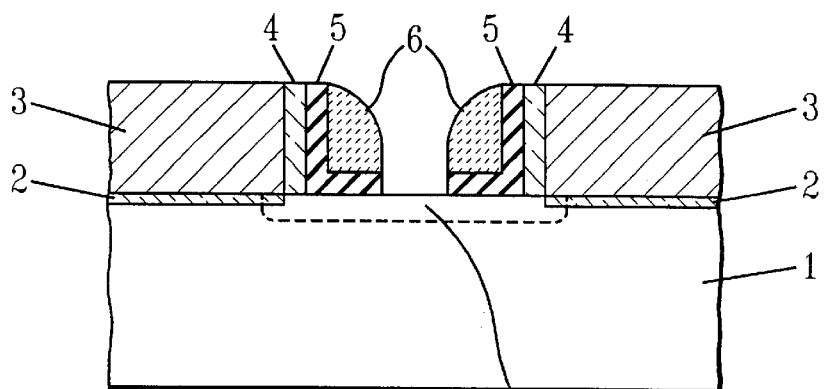
FIGS. 1–5 illustrate a semiconductor structure according to the present invention in various stages of fabrication.

In order to facilitate an understanding of the present invention, reference will be made to the various figures. The present invention provides a method for increasing the space available for silicide formation between adjacent gate structures thereby lowering the diffusion resistance. The method of the present invention permits effectively increased spacing for silicide formation without degrading the device short channel behavior.

In particular, according to the present invention, a semiconductor substrate 1 and gate conductor 3 located above gate insulator 2 is provided. The semiconductor substrate is typically silicon and the gate insulator 2 is typically silicon dioxide. A typical gate conductor 3 is a doped polycrystalline silicon, often referred to simply as polysilicon.

The thin gate insulator 2 is typically grown on or deposited onto the substrate 1. The gate insulator is typically about 30 to about 100 Å thick and can be formed by thermal oxidation of the silicon substrate at about 700–800° C. in the presence of dry oxygen or steam. A layer of conductor such as polycrystalline silicon 3 can be deposited on the gate insulator oxide. The polysilicon layer is typically about 1500 to about 3000 Å thick and may be formed for instance by chemical-vapor deposition. The gate oxide and gate conductors can then be defined by conventional lithographic techniques.

If desired, dopants 10 can optionally be implanted into the substrate in the spacing between adjacent gates. Typical dopants include n-type dopants such as phosphorous and arsenic and p-type dopants such as boron. The dosage of the dopants is typically about 1E12 to about 1E15.

Optionally, but not required, as illustrated in FIG. 1, an insulating spacer 4 is provided on sidewalls of the gates 3. This insulating spacer 4 is typically silicon dioxide or silicon nitride. Typically, this spacer, when present, is about 60 Å to about 500 Å, and more typically about 100 Å to about 400 Å thick.

The insulating sidewall spacer 5 is provided on the first sidewall spacer 4. The second sidewall spacer is typically silicon nitride. The silicon nitride spacers are generally L-shaped and include spacing between adjacent spacers on adjacent gate structures.

The generally L-spaced structure can be formed by blanket depositing a layer of silicon nitride followed by blanket depositing a layer 6 of silicon oxide. The silicon nitride can be formed by chemical vapor deposition. The thickness of the silicon nitride is typically about 100 to about 500 Å and more typically about 300 to about 400 Å.

The layer 6 of silicon oxide is typically provided by low pressure chemical vapor deposition using TEOS (tetraethylorthosilicate) as a reactant gas forming the silicon oxide.

The TEOS oxide layer 6 and silicon nitride layer 5 are then directionally etched back to form insulating sidewall spacers having L-shaped silicon nitride 5. The etching is typically a reactive ion etch (RIE) typically employing fluorocarbon etch chemistry.

Figure 2:
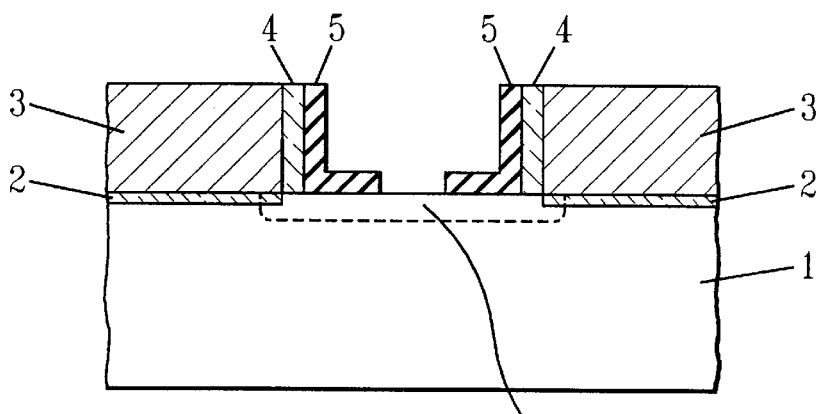

The TEOS can be selectively etched by a wet etchant such as a dilute deionized water hydrofluoric acid composition typically containing about 0.1% to about 5% by weight hydrofluoric acid. See FIG. 2.

The spacing between adjacent L-shaped insulating spacers is at least about 0.05 μm and is more typically about 0.1 μm to about 0.5 μm, and preferably about 0.2 μm to about 0.4 μm.

Figure 3:
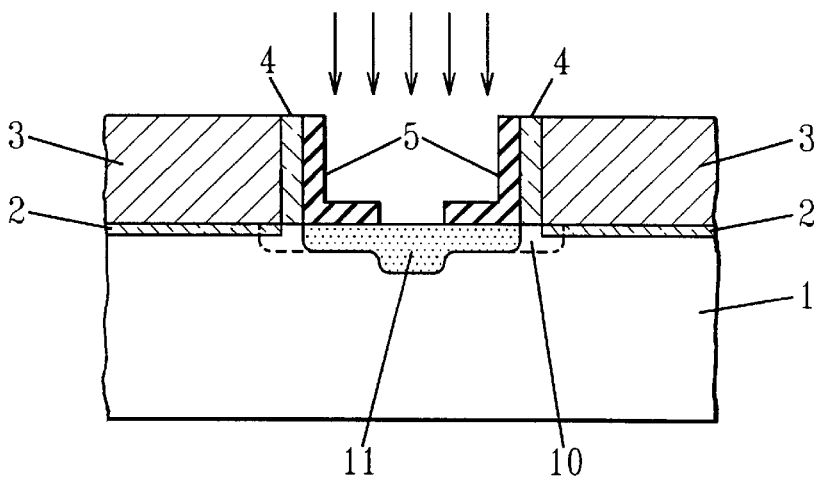
Figure 4:
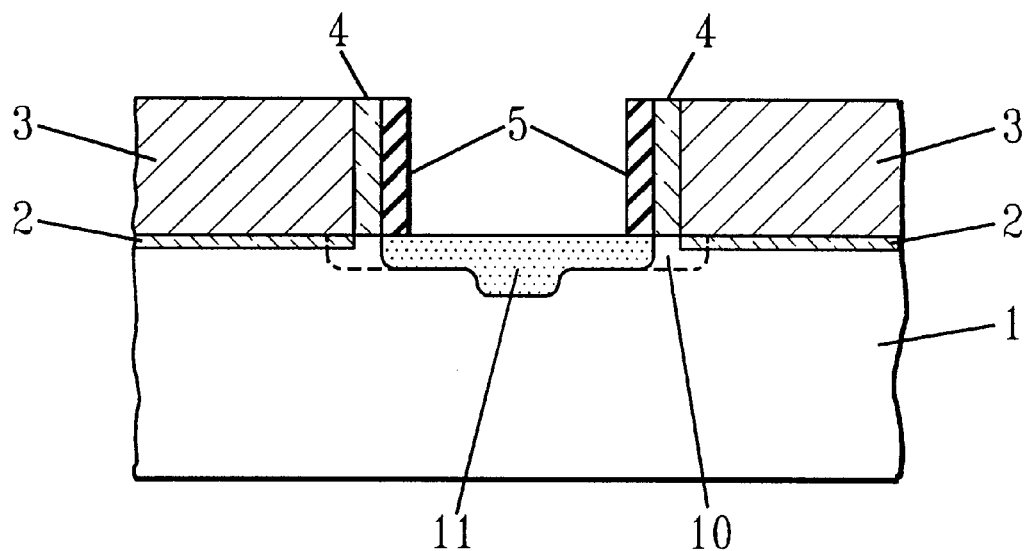
Figure 5:
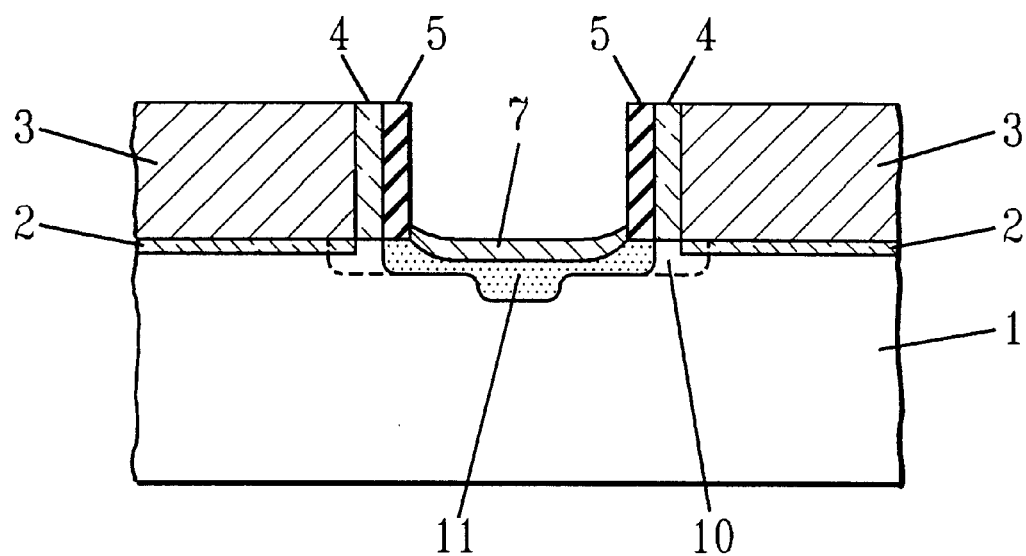

After the TEOS layer 6 is removed, source/drain implants 11 are placed between adjacent L-shaped insulating spacers and beneath the horizontal portion of the L-shaped insulating spacers. See FIG. 3. The peak of the implant is within the vicinity of the horizontal portion of the L-shaped spacer and silicon interface as illustrated in FIG. 3. Typically dosages for the implant are about 1E15 to about 5E15. The implant is partially blocked (e.g. about 50 to about 75%) by the horizontal portion of the spacer, thereby reducing the source/drain depth adjacent to the gate. To achieve the blocking, the implant energy is typically about 10 to about 60 keV and more typically about 30 to about 45 keV. The thickness of the L-shaped spacer employed to achieve the desired degree of blocking is directly related to the implant energy. In other words, thicknesses at the lower end of the above range would be selected for lower energy implants. Conversely, an increased thickness of the L-shaped spacer would be employed for implant energies at the upper end of the above range. The source/drain doping is typically located beneath the subsequently to be formed metallic silicide to a depth of at least about 0.1 μm in the semiconductor substrate.

The polycrystalline silicon layer is doped by this source/drain implant.

Next, the spacer foot or horizontal portion of the second insulating spacer 5 is removed such as by directional reactive ion etching employing fluorocarbon chemistry.

Typically, the source/drain is electrically activated by annealing at temperatures of about 950 to about 1050° C.

Next, a metallic silicide 7 is formed in the spacing between adjacent gate structures.

The metallic silicide 7 can be formed by sputter deposition of a refractory metal such as titanium or cobalt, followed by heating to temperatures of about 550° C. to about 700° C. whereby reaction between the metal and underlying silicon occurs to form the silicide. Unreacted metal can then be removed by a wet etch in hydrogen peroxide/sulfuric acid or an ammonium hydroxide, hydrogen peroxide and water solution. The silicide layer is typically about 300 to about 500 Å thick.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method for fabricating a semiconductor structure which comprises providing a semiconductor substrate; providing a plurality of gates located on the semiconductor substrate and separated from the semiconductor substrate by a first insulating layer; implanting dopants into the substrate between adjacent gates; then providing insulating spacers on sidewalls of the gates; wherein the insulating spacers are generally L-shaped having a vertical portion and a horizontal portion and wherein spacing exists between adjacent L-shaped insulating spacers; implanting source/drain dopant between adjacent L-shaped insulating spacers and beneath the horizontal portion of the L-shaped insulating spacers;

wherein the horizontal portion of the L-shaped spacer partially blocks the source/drain implants and wherein said dopant has a peak within the vicinity of said spacing between the horizontal portion of said insulating spacers; and then removing the horizontal portion of the L-shaped insulating spacers by etching; and forming a metallic silicide in the spacing between remaining vertical portions of the insulating spacers.

2. The method of claim 1 wherein the semiconductor substrate is silicon.

3. The method of claim 1 wherein the L-shaped insulating layer comprises silicon nitride.

4. The method of claim 1 wherein the plurality of gates are polycrystalline silicon.

5. The method of claim 1 wherein the spacing between a sidewall of at least one gate and the sidewall of an adjacent gate is about 0.5 μm or less.

6. The method of claim 1 which further comprises providing a second insulating spacer between the L-shaped insulating spacer and sidewall of the gate.

7. The method of claim 6 which comprises forming the second insulating spacer by chemical vapor deposition of silicon nitride or silicon oxide or both.

8. The method of claim 1 wherein the metallic silicide is titanium silicide.

9. The method of claim 1 wherein the metallic silicide is cobalt silicide.

10. The method of claim 1 wherein the horizontal portion of the L-shaped insulating spacer is removed by reactive ion etching.

11. The method of claim 1 which further includes thermally annealing to activate source/drain dopants.

12. The method of claim 11 wherein the thermally annealing is carried out after removing the horizontal portion of the L-shaped insulating spacers and before forming the metallic silicide.

13. The method of claim 11 wherein the thermally annealing is carried out prior to removing the horizontal portion of the L-shaped insulating spacers.

14. The method of claim 11 wherein the annealing is carried out at temperatures of about 950 to about 1050° C.

15. The method of claim 11 wherein the dosage of the dopants is about 1E12 to about 1E15.

16. The method of claim 1 which comprises forming the L-shaped spacers by depositing a layer of silicon nitride followed by depositing a layer of silicon oxide using TEOS and then directionally etching back the layer of silicon oxide and layer of silicon nitride and then removing the remaining layer of silicon oxide.

17. The method of claim 1 wherein the dosage of the source/drain implants is 1E15 to 5E15.

18. The method of claim 1 wherein the thickness of the L-shaped insulating spacers is about 100 to about 500 Å.

19. The method of claim 1 wherein the thickness of the L-shaped insulating spacers is about 300 to about 400 Å.

* * * * *

UNITED STATES PATENT AND TRADEMARK OFFICE
CERTIFICATE OF CORRECTION

PATENT NO. : 6,235,597 B1
DATED : May 22, 2001
INVENTOR(S) : Glen L. Miles

It is certified that error appears in the above-identified patent and that said Letters Patent is hereby corrected as shown below:

Column 6,
Line 1, change "11" to -- 1 --.

Signed and Sealed this

First Day of October, 2002

Attest:

JAMES E. ROGAN
Attesting Officer  Director of the United States Patent and Trademark Office